United States Patent [19]
Hallock et al.

[11] Patent Number: 5,981,147
[45] Date of Patent: *Nov. 9, 1999

[54] STABLE, IONOMERIC PHOTORESIST EMULSION AND PROCESS OF PREPARATION AND USE THEREOF

[75] Inventors: John Scott Hallock; Alan Frederick Becknell, both of Ellicott City; Cynthia Louise Ebner, New Market; Daniel Joseph Hart, Finksburg, all of Md.

[73] Assignee: Mac Dermid Incorporated, Waterbury, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/835,873

[22] Filed: Apr. 8, 1997

Related U.S. Application Data

[63] Continuation of application No. 08/208,546, Mar. 9, 1994, abandoned.

[51] Int. Cl.$^6$ ........................................ G03F 7/33
[52] U.S. Cl. ..................... 430/281.1; 430/271.1; 430/286.1; 430/275.1; 522/85
[58] Field of Search .............. 430/271.1, 281.1, 430/286.1, 275.1; 522/85

[56] References Cited

U.S. PATENT DOCUMENTS

| | | | |
|---|---|---|---|
| 5,045,435 | 9/1991 | Adams et al. | 430/288 |
| 5,115,031 | 5/1992 | Heim et al. | 525/234 |
| 5,364,737 | 11/1994 | Barr | 430/281 |
| 5,387,494 | 2/1995 | Barr et al. | 430/281 |
| 5,389,495 | 2/1995 | Barr | 430/281 |
| 5,393,643 | 2/1995 | Lundy et al. | 430/281 |
| 5,411,837 | 5/1995 | Bottomley et al. | 430/281 |
| 5,439,766 | 8/1995 | Day et al. | 430/18 |
| 5,576,145 | 11/1996 | Keil et al. | 430/281.1 |
| 5,609,991 | 3/1997 | Briguglio et al. | 430/281.1 |

*Primary Examiner*—Nam Nguyen
*Assistant Examiner*—Steven H. Ver Steeg
*Attorney, Agent, or Firm*—John L. Cordani

[57] ABSTRACT

Disclosed are waterborne, stable photoresist compositions and methods of their preparation and use. The compositions are characterized by increased shear and storage stability. The photoresist composition comprises an aqueous emulsion of a 22% or less neutralized carboxylated resin and non-ionic surfactant containing poly(ethylene-oxide) segments, photopolymerizable monomer and photoinitiator. Neutralization is accomplished using either an organic or an inorganic base or mixtures thereof. The photoresist compositions are useful to selectively coat and protect surfaces subjected to corrosive environments, e.g., etchant processes, in the production of circuit traces for electronic circuit boards.

23 Claims, No Drawings ium
STABLE, IONOMERIC PHOTORESIST EMULSION AND PROCESS OF PREPARATION AND USE THEREOF This is a continuation of application Ser. No. 08/208,546, filed Mar. 9, 1994 now abandoned.

FIELD OF THE INVENTION

This invention is related to the formation of patterned images upon substrates. More particularly, the invention is related to novel photoresist emulsions and the use thereof for producing patterned images during the production of printed circuit boards and like electronic components.

BACKGROUND OF THE INVENTION

The use of photoresists in the course of manufacture of printed circuit boards and the like, is well-known and well-established. Basically, the process comprises forming a layer of a photoresist material (or, simply, "resist") upon an appropriate substrate; patternwise exposing the layer to actinic radiation; and then "developing" the exposed layer by removal of uncured portions of the layer not exposed to the radiation. In particular, a photoresist technique is used to produce patterned images for selective etching of a metal substrate, for the plating of a metal upon a substrate, and for the application of a solder to a substrate.

Much emphasis is placed on efforts to avoid the use of organic solvents in the preparation and use of photoresists. Increasingly, photoresist systems based on water are being used and can be supplied in film or liquid form. See, for example U.S. Pat. Nos. 4,100,047, 4,564,580 and 4,133,909 which describe aqueous coatings; and U.S. Pat. Nos. 3,953,309 and 4,361,640 which teach compositions that can be developed with aqueous solutions. Another aqueous processable photopolymerizable composition is described in U.S. Pat. No. 4,510,230, disclosing organic acids employed within an acid binder photopolymer composition to decrease scum or stain on a copper surface.

Aqueous emulsions, while more environmentally acceptable, are often plagued with stability problems associated with the processing and applications of the emulsions. In processing of the aqueous emulsions, high shear rates are frequently used in the emulsification process, especially in the case of direct emulsification of previously synthesized polymers. In many cases the emulsions are then concentrated by evaporation of water and/or organic solvents, often under vacuum and with heat and mechanical shear stress applied (e.g. wiped film evaporators). In the cases where organic solvents are emulsified along with other water-insoluble components, the evaporation process itself can be mechanically stressful as the solvent vapors must pass through the surfactant boundary, thus disrupting the stabilizing forces. Finally, the emulsions are frequently formulated with other additives using high shear rates to mix the components. Examples range from pigment grinding, a very high shear process, to simple admixing of water soluble additives. Often times these additives, examples of which include water-dispersable thickeners and organic cosolvents, can increase emulsion sensitivity to mechanical or thermal stress.

In application, aqueous emulsions may be applied as coatings to substrates using a variety of methods which may involve a range from a very low shear to a very high shear process. Among the higher shear processes are spraying and roll-coating processes. Roll-coating can be especially stressful due to longer exposure time of the emulsion composition to high shear (i.e., in the roller nips). For practical utility, it is imperative that the emulsion composition does not degrade or coagulate under such conditions.

Optimization of surfactants has traditionally been the approach taken to overcome shear stability problems in aqueous emulsion systems. However, high levels of surfactants are often required to provide stability, but excessive levels of surfactants can cause additional problems. These additional problems include foam stabilization during high shear process which can lead to the formation of bubbles or pinholes in the final film product. Excessive levels of surfactants can also lead to adhesion failure at the substrate/coating interface and sensitivity of the resulting coating to water or humidity.

Consequently, there exists a need for photoresist materials, and processes associated therewith, which meet the requirements for a waterborne, liquid applied contact imageable photoresist and yet possess mechanical or shear stability while minimizing the need for surfactants.

SUMMARY OF THE INVENTION

Therefore, it is an object of this invention to provide photoresist compositions which are water-borne and aqueous alkali developable which possess improved storage and shear stability while requiring no organic solvents.

It is another object of the present invention to provide water-borne, photoresist compositions which have increased stability in the presence of conventional additives and thickeners while minimizing the use of surfactants.

It is yet another object of this invention to provide a roll-coatable, water-borne, aqueous alkali developable photoresist composition which is both storage stable and shear stable.

It is a related object of this invention to provide methods for the stabilization of negative-acting, water-borne, photoresist compositions.

It is a general object of this invention to provide water-borne photoresist compositions and methods for effectively coating and selectively protecting metallic surfaces during the production of printed circuit boards and other electronic components.

The present invention is a new and useful aqueous photoresist composition which can be characterized by increased storage and shear stability, and which is prepared from emulsified, surfactant dispersed, carboxylic acid containing resins. In particular, the present invention comprises an aqueous emulsion of a carboxylic acid containing resin; photopolymerizable monomer; a photoinitiator; a non-ionic surfactant (which can be dissolved or dispersed in water or dissolved in an organic solvent) and a water-soluble or water dispersable, inorganic or organic base to accomplish selective neutralization of the carboxylic acid groups on the resins.

These components can be combined in a variety of sequences to achieve the present invention. Typically the carboxylic acid containing resin, photopolymerizable monomer, and photoinitiator are dissolved in an organic solution and then added to water which has the non-ionic surfactant either dissolved or dispersed therein. The emulsion is then neutralized with an organic or inorganic base, comminuted, and if desired, the solvent can be evaporated off. Alternative methods include having the surfactant in the organic solution with the carboxylic acid containing resin. Similarly, water, with or without the surfactant, can be added to the organic solution, with or without the surfactant.

Furthermore, the base used to neutralize the acid groups can be either dissolved or dispersed in either the water or the organic solution in addition to being added separately after the emulsion is created. Moreover, neutralization, comminution and evaporation can occur in any sequential order or, where possible, simultaneously.

Not only is shear stability unexpectedly increased by adding base equivalent to partially neutralize the carboxylic acid groups on the surfactant dispersed resins, but storage stability of the emulsions was surprisingly increased, even with the addition of conventional additives and thickeners.

DETAILED DESCRIPTION OF THE INVENTION

In general, photoresist compositions in accordance with the invention are aqueous photoresist emulsions comprising
- (a) a carboxylic acid containing resin;
- (b) a photopolymerizable monomer;
- (c) photoinitiator;
- (d) non-ionic surfactant containing poly (ethylene-oxide) segments; and
- (e) a base that is selected from organic or inorganic bases, and mixtures thereof;

wherein the base is present in an amount of no greater than about 0.22 equivalents per acid equivalents on the resin, and wherein components (a)–(d) are present in the emulsion in an amount sufficient to provide a waterborne, stable, homogeneous photoresist coating material which is aqueous alkali developable to form an image on a surface such as a metal surface.

The emulsion of the present invention can be achieved in a variety of ways. A method of preparing a photoresist composition of the present invention comprises the steps of
- (a) preparing an emulsion by combining a non-ionic surfactant containing poly(ethylene-oxide) segments with water and an organic solution comprising:
  - (i) carboxylic acid containing resin,
  - (ii) photopolymerizable monomer, and
  - (iii) photoinitiator; and wherein a base selected from organic and inorganic bases and mixtures thereof is dissolved or dispersed in either the water or the organic solution thereby partially neutralizing the acid containing resin; and
- (b) comminuting the neutralized emulsion until a particle size distribution having a D(v,0.9) no greater than 1.4 microns is obtained.

Another method of preparing a photoresist composition of the present invention comprises the steps of
- (a) preparing an emulsion by combining a non-ionic surfactant containing poly(ethylene-oxide) segments with water and an organic solution comprising:
  - (i) carboxylic acid containing resin,
  - (ii) photopolymerizable monomer, and
  - (iii) photoinitiator;

and completing the method with either of the following additional steps:

I. (b) partially neutralizing the emulsion with a base selected from organic and inorganic bases and mixtures thereof;
  (c) comminuting the neutralized emulsion until a particle size distribution having a D(v,0.9) no greater than 1.4 microns is obtained; and
  (d) optionally, the solvent and/or water can be evaporated from the emulsion until a total solids content no greater than about 60% by weight of the emulsion is achieved; or II. (b) comminuting the emulsion until a particle size distribution having a D(v,0.9) no greater than 1.4 microns is obtained;
  (c) partially neutralizing the emulsion with a base selected from organic and inorganic bases and mixtures thereof; and
  (d) optionally, the solvent and/or water can be evaporated from the emulsion until a total solids content no greater than about 60% by weight of the emulsion is achieved;

or

III. (b) comminuting the emulsion until a particle size distribution having a D(v,0.9) no greater than 1.4 microns is obtained;
  (c) evaporating the solvent and/or water from the emulsion until a total solids content no greater than about 60% by weight of the emulsion is achieved; and
  (d) partially neutralizing the emulsion with a base selected from organic and inorganic bases and mixtures thereof.

The photoresist emulsions are useful to effectively coat and selectively protect surfaces, including metallic, glass or polymeric etc. surfaces, by simply applying said emulsions onto the surface to produce a coating on said surface; drying the coating to produce a non-tacky photoresist coating on the surface; exposing said photoresist coating to actinic radiation in an image-wise fashion; and contacting said exposed surface with an alkali base developing solution to develop an image on said surface. Thereafter, the photoresist coated imaged surface can be etched or plated, and the photoresist stripped to yield the desired circuit, wiring board, printing plate or other desired product. The emulsion can be applied to the surface using roll coating, spraying, curtain sheeting and other techniques that are generally known in the field.

Resins which are suitable for the photoresist emulsions include, but are not limited to, carboxylic acid containing polymers or copolymers of one of the following monomers; styrene, butadiene, isoprene, vinylidene chloride, methyl acrylate, ethyl acrylate, butyl acrylate, methyl methacrylate, ethyl methacrylate, butyl methacrylate, acrylonitrile, acrylic acid, itaconic acid, methacrylic acid, vinyl alcohol, maleic anhydride and vinyl acetate. Specific copolymers may include:

butadiene/acrylonitrile/methacrylic acid,
styrene/acrylic acid,
styrene/butadiene/acrylic acid,
styrene/butadiene/methacrylic acid,
styrene/butadiene/itaconic acid,
styrene/butadiene/maleic acid,
styrene/butadiene/butylacrylate/acrylic acid,
styrene/butadiene/butylacrylate/methacrylic acid,
styrene/butadiene/butylacrylate/itaconic acid,
styrene/butadiene/butylacrylate/maleic acid,
styrene/ethyl acrylate/methacrylic acid,
styrene/maleic anhydride,
styrene/methacrylic acid, and
vinylidene chloride/methacrylic acid and mixtures of two or more of the foregoing.

Resins comprising acid or anhydride functional copolymers which have been partially modified by reaction with compounds such as simple alkyl alcohols, e.g., acid resins esterified with butanol, may also be used. Preferred commercially available resins include Joncryl® 67 styrene/ acrylic acid copolymer from Johnson Wax. Acrylate or styrene/acrylate copolymers, such as Carboset XL-27 and Carboset GA1250 from BF Goodrich Co., are also preferred. SMA 17352 from Atochem, Inc., a styrene/maleic anhydride copolymers partially esterified with simple alkyl alcohols is also a suitable acid containing co-polymer. Other carboxylic acid containing resins that are partially esterified styrene maleic anhydride copolymer are Scripset 1710, 540, 550 and 640 from Monsanto Chemical, Co.

It is within the scope of the invention to use a blend of resins. When using a blend of resins it is not critical that all resins comprising the blend be acid-functional. Whether using a resin or resin blend the resin component of the composition must contain an acid number of approximately 90 to about 250 and have a glass transition temperature sufficient to make sure the resist film formed is non-tacky, typically above about 60° C.

The photoresist emulsions of this invention are negative-acting photoresist compositions. As is well known in the art, a negative-acting photoresist material is a photopolymer which is polymerized upon exposure to actinic radiation and becomes insoluble or less soluble in the developer solution. It is within the scope of the invention that the resin and photoinitiator or photopolymerizable components be chemically separate components or they may be chemically bound together. Esacure KIP (oligo[4-(alpha-hydroxyisobutyryl)-alpha-methylstyrene]) from Sartomer Inc. is an example of resin and photoinitiator chemically bound. An example of the chemically bound resin and photopolymerizable component is styrene/maleic anhydride copolymer functionalized with hydroxyethyl acrylate or similar acrylate functionality such as Sarbox SB-401 from Sartomer Inc.

Suitable negative-acting photopolymerizable monomers include generally, but are not limited to, acrylates. More specifically, they include acrylic and methacrylic acid esters of mono-, di-, and polyhydric alcohols; and mono-, di-, and polyalkoxy acrylate and methacrylate and mixtures thereof.

Also suitable are mono-, di-, poly- acrylates or methacrylates which are derivatized from the reaction of hydroxyl terminated acrylate or methacrylate esters with mono-, di-, and polyisocyanates, epoxides, and other hydroxy reactive compounds. Specific examples include:

ethylene glycol diacrylate,
ethylene glycol dimethacrylate,
propylene glycol diacrylate,
propylene glycol dimethacrylate,
trimethylolpropane triacrylate,
trimethylolpropane ethoxylate triacrylate,
trimethylolpropane propoxylate triacrylate,
trimethylolpropane ethoxylate trimethacrylate,
trimethylolpropane propoxylate trimethacrylate,
bisphenol A diacrylate,
phenoxyethyl methacrylate,
hexanediol diacrylate,
neopentyl glycol diacrylate,
neopentyl propoxylate diacrylate,
pentaerythritol triacrylate,
dipentaerythritol hydroxypentaacrylate, and
polyethylene glycol diacrylate and mixtures of two or more of the foregoing.

Trimethylolpropane ethoxylate triacrylate is a preferred monomer and is available as Photomer® 4149 and 4155 from Henkel Corporation. Other preferred negative acting acrylate monomers prepolymers include those known under the Trademark Sartomer® 454, 205, and 399 from Sartomer Co.

The ratio of resin to photopolymerizable monomer in the emulsions can vary widely provided that the dried photoresist film be substantially tack-free. Parameters that tend to affect the level of tack in the film in addition to this ratio are the $T_g$ of the resin(s), the level and type of neutralizing base, and the presence of certain additives, especially surface-active additives that reduce tack (e.g. wax emulsions). Typically, the ratio of resin to photopolymer will range from about 95:5 to about 50:50. The amount of photoinitiator in the composition is in the range of about 0.1% to about 20% by weight of non-volatile components.

When using the photopolymerizable monomers as described above, it is necessary to use a photoinitiator. Suitable photoinitiators for initiating polymerization of the negative acting photoprepolymers with UV radiation include, but are not limited to, benzoin ethers, benzil ketones, and phenones and phenone derivatives and mixtures of two or more of the foregoing. The amount of photoinitiator in the composition is in the range of about 0.1% to about 20% of the non-volatile components.

Examples are:
isopropylthioxanthane,
acetophenone,
9,10-anthraquinone,
benzil,
benzil dimethyl ketal,
benzoin,
benzoin tetrahydropyranyl ether,
benzoin isobutyl ether,
benzophenone,
benzoyl cyclobutanone,
4,4'-bis(dimethylamino)benzophenone,
2,2-dimethoxy-2-phenyl acetophenone,
dibenzosuberone, and
2-methyl-1-[4-methylthiophenyl]-2-morpholino propane.

Bases which are useful in the present invention are water-soluble or water dispersable, organic or inorganic bases. Preferred bases include alkali metal salts, e.g., lithium hydroxide, sodium hydroxide, potassium hydroxide. The alkali metal salts are desirable because they provide de-tackifying and antiblocking properties in the dried film. Other preferable bases include amines. It is possible to use neutralizing bases that are mixtures of two or more of the alkali metal salts and amines. The amount of base which is used in the photoresist emulsions of the invention is that amount which is sufficient to neutralize 22% or less, preferably about 20% to about 5%, of the carboxylic acid groups on the resin. That is, the amount of base used is no greater than about 0.22 equivalents per equivalent of acid, preferably about 0.05 to about 0.2 equivalents per equivalent of acid. It is also possible to use mixtures of two or more bases to neutralize the acid groups.

In addition to partial neutralization, non-ionic surfactants are used to promote adequate storage and shear stability in the photoresist emulsions of the invention. Suitable surfactants are non-ionic, surfactants having poly(ethylene-oxide) ("EO") segments, wherein the ethylene oxide segment is repeated at least four times. In particular, for improving shear stability, alkyl phenol ethoxylates, where the number of moles of ethylene oxide in the ethoxylate chain is greater than about 9, are preferred surfactants. Surfactants are used in an amount of about 0.1 to about 10%, preferably about 0.5% to about 5%, of the emulsion solids.

Surfactants which are suitable include, but are not limited to the following:

The Triton X series of ethoxylated octylphenyl polyether alcohols from Union Carbide:

Triton X-705, 70 EO units, HLB=>18,
Triton X-405, 40 EO units, HLB=17.9,
Triton X-305, 30 EO units, HLB=17.3, and
Triton X-100, 9–10 EO units, HLB=13.5.

The Tergitol NP series of ethoxylated nonyl phenols from Union Carbide is also suitable and includes:

Tergitol NP-70, 70 EO units, HLB>18,
Tergitol NP-40, 40 EO units, HLB=17.8,
Tergitol NP-15, 15 EO units, HLB=15.0, and
Tergitol NP-10, 10 EO units, HLB=13.6.

The Pluronic series of ethylene oxide/propylene oxide block copolymers from BASF are suitable surfactants and include:

Pluronic P-105, 50% EO; HLB=12–18,
Pluronic F-127, 70% EO; HLB=18–23,
Pluronic P-104, 40% EO; HLB=12–18, and
Pluronic L-35, 50% EO; HLB=18–23.

The Tetronic series of tetra functional block copolymers derived from the sequential addition of propylene oxide and ethylene oxide to ethylenediamine, from BASF are also suitable and include:

Tetronic 908; HLB=24,
Tetronic 904; HLB=12–18, and
Tetronic 704; HLB=12–18.

Additional suitable surfactants are Witconol H-31A from Witco Corporation a polyethyleneglycol monooleate and the Witconol SN Series, from Witco Corp., a series of ethyleneoxide adducts of straight chain fatty alcohols. Mixtures of suitable surfactants can also be used.

Photoresist emulsions of this invention can be prepared by direct or inverse emulsification of a photoresist solution. With either of these techniques it is necessary to obtain sufficient particle size reduction so as to obtain a storage stable emulsion. We have found that by partially neutralizing the acid-functional resin during the emulsification process the efficiency of the emulsification process is greatly increased. That is, for a given set of process conditions the average particle size of a partially neutralized emulsion will be significantly smaller than that of an unneutralized emulsion. As the neutralization level is increased, the particle size becomes still smaller. This increased emulsification efficiency may be due to the creation of polymeric surfactant (partially neutralized resin), thereby increasing the total level of available surfactant (conventional+polymeric) available to stabilize particles. This effect can be extremely advantageous as it may allow lower levels of conventional surfactant to be used.

Another benefit derived from this increased emulsification efficiency is the ability to use less solvent and/or water during the emulsification process, thereby addressing environmental concerns regarding solvent emissions and energy consumption. When preparing the emulsions by direct or inverse emulsification of a solution of the photoresist components in organic solvent, the amount of solvent to use is a key consideration. The less solvent used, the more viscous the solution, and the less effectively it is emulsified (i.e., the larger the particle size). Thus, by partially neutralizing the resin during emulsification the effects of the more viscous solution can be counteracted. It is preferred that the organic solvent have a low boiling point (preferably no higher than 120 degrees C.). Preferred, solvents are toluene, ethyl acetate, diethyl ether, methyl ethyl ketone, methylene chloride, chloroform, carbon tetrachloride and mixtures thereof.

Even though a certain minimum particle size must be obtained for adequate shelf life, it is not necessarily desirable to obtain the smallest possible particle size for other reasons. For example, the application rheology of an emulsion system is affected by the average particle size. It may be desirable to obtain an intermediate particle size in which case several of the emulsification parameters must be balanced (e.g. % neutralization, surfactant level, and solvent level).

A number of variations in the order of addition of the photoresist, organic solution, water, surfactant and base are possible. However, some are more preferable than others. For instance, while it is possible to first form a water-in-oil emulsion followed by inversion to the final oil-in-water emulsion, this is often not desirable because the intermediate emulsion may pass through a very viscous stage that is difficult to process. In these cases direct emulsification of the photoresist solution into water under agitation may be preferable. Another variable in the emulsification process is surfactant placement/order of addition. Surfactants may be placed in the water prior to mixing with the photoresist solution, in the photoresist solution prior to mixing with water, or post added to a crude emulsion. It is advantageous to place the surfactant(s), preferably non-ionic long-chain poly(ethylene-oxide) based surfactant(s), into the water prior to the addition of the photoresist solution in the case of direct emulsification. Similarly, the base can be added at different points in the process of making the emulsion. If it is placed in the water prior to addition of the photoresist solution the resulting crude emulsion may be less efficiently comminuted, resulting in a larger particle size emulsion. It is most advantageous to partially neutralize the emulsion after all of the other components have been combined but before comminution; in this way a much smaller particle size emulsion will result.

Another method for forming the emulsion is by first forming an emulsion of component (a) by standard emulsion polymerization techniques. A typical emulsion polymerization is described in U.S. Pat. No. 3,929,743. Suitable polymerization initiators include free radical generators such as peroxy disulfates- and persulfate-iron-bisulfate or metabisulfate systems. Detailed techniques, methods and conditions for emulsion polymerization are described in F. W. Billmeyer, *Textbook of Polymer Science* (Wiley-Interscience, New York; 2ed 1971); K. Boevy, et al., *Emulsion Polymerization*, (Interscience Publishers, Inc.; New York 1955); and G. M. Dekker, *Kinetics and mechanisms of polymerization*, Vol. 1 (Ed. by G. E. Ham 1969). The resulting latex contains resin particles which would constitute resin (a) of the present invention emulsion. Components (b), (c), (d), and (e) can be added in a subsequent step by simple mixing.

Suitable commercially available latices include Neocryl® CL-340 (40% solids acrylic latex copolymer of methylmethacrylate, butyl acrylate and methylacrylic acid), available from ICI Resins U.S. This latex has an acid number of 145, $T_g$ of 94° C., and Mw of 15,835. Another suitable latex is Acrysol® I-2074 from Rohm & Haas Co. (46% solids acrylic latex co-polymer of methylmethacrylate, styrene, methacrylic acid). This latex has a $T_g$ of 138° C., acid number of 160, and Mw of 5,600.

When using any of the above-described methods for preparing the emulsion, the amounts of (a), (b) and (c) should be an amount sufficient to provide a total solids content of the emulsion generally in the range of about 1% to about 60% by weight of the emulsion, preferably about 30% to about 50% by weight of the emulsion.

Thickening agents may be desirable depending upon the method of application. Suitable thickening agents include, but are not limited to, hydroxyethyl-cellulose, associative thickeners (e.g., Acrysol® RM 825 and Acrysol RM 2020, available from Rohm & Haas), and clays (e.g., Laponite®, available from Laporte). Thickening agents are typically used in the emulsions in an amount of from about 0.1% to about 10% of thickener solids to emulsion solids. A preferred amount is about 0.2% to about 2.0%.

Other additives may also be included in the photoresist emulsion. Depending upon the additives used, the additives may be included as one of the original emulsion forming components or they can be added after the emulsion has been formed. Suitable additives include, but are not limited to, coalescing agents, stabilizers, defoamers, pigments, flow aids and adhesion promoters. Commercially available stabilizers for negative photoactive photopolymers include hydroquinone, p-methoxyphenol, pyrogallol, 2,6-di-t-butyl-4-methylphenol and phenothiazine. Available pigments and dyes include any of a wide variety, e.g., Neopen Blue 808® from BASF. Suitable coalescing agents are glycol ethers and esters such as PM Acetate® (propylene glycol monomethyl ether acetate) from Eastman Chemical Co. and Butyl Dipropasol® (dipropylene glycol monobutyl ether), Hexyl Carbitol® (hexyloxyethoxy ethanol) and UCAR® ester EEP (ethyl 3-ethoxy propionate) from Union Carbide Suitable film aids include Byketrol-WS from BYK-Chemie and EFKA-LP 7022 from EFKA. Suitable adhesion promoters include benzotriazole and carboxybenzotriazole. Wetting agents include Dapro W-77 interfacial tension modifier from Daniel products. Wax additives include Paracal 802N wax emulsion from Hercules Chemical Corp.

Partial neutralization of the emulsion is a critical factor in getting the proper shear stability in the photoresist compositions of the invention. Partial neutralization of the emulsions may be accomplished either prior to, during or after emulsification of the photoresists. When preparing the photoresist emulsions by direct emulsification, it is desirable to dissolve components (a), (b) and (c) in an organic solvent prior to emulsification with water and components (d) and (e). Neutralization may be accomplished by addition of the base in the organic solution containing components (a), (b) and (c). In the alternative, the base may be added to the water phase during the emulsification step. Post-neutralization by addition of the base to the comminuted emulsion is also within the scope of the present invention. It is preferable to neutralize the emulsion after components (a), (b), (c) and (d) are combined and before comminution.

In one embodiment, the present invention provides a method to effectively coat and selectively protect surfaces by applying a protective coating on the surface and then selectively processing the coating so that only certain portions of the surface remain coated. This is particularly useful in the electronics industry for use in the production of circuit and wiring boards. Such a method comprises:
 (a) applying to a metallic surface a coating of an aqueous emulsion comprising:
  (i) carboxylic acid functional resin;
  (ii) photopolymerizable monomer;
  (iii) photoinitiator;
  (iv) a base selected from organic and inorganic bases, and mixtures thereof; and
  (v) non-ionic surfactant containing poly(ethylene-oxide) segments;
  wherein components (i)–(iv) are present in amounts sufficient to provide a photoresist coating on said metallic surface;
 (b) exposing said photoresist coating to actinic radiation in an image-wise fashion; and
 (c) immersing said exposed coating in a developer to develop an image on said metallic surface.

To obtain a photoresist coating on a metallic surface, standard coating techniques may be used. For example, the photoresist emulsion may be applied by dip coating, spraying, screen printing, etc. It is preferred to apply the emulsion to a metallic surface by roll coating.

In addition to advantages of increased compatibility with certain additives and greatly improved shear stability, partially neutralizing the acid functional resin in the emulsion at 22% or less provides a relatively low level of viscosity in the emulsion. At the higher level of neutralization, the viscosity may increase substantially due to solubilized resins in the continuous phase of the emulsion. The rheology, e.g., shear thinning or thixotropic characteristics of the emulsion, may also be adversely affected by a highly neutralized dissolved resin. In addition, the lower level of neutralization, i.e. 20% or less, allows the emulsion to be concentrated to a higher percent of solids without the emulsion obtaining an impractically high viscosity.

It is well known to those skilled in the art that the storage stability of an emulsion is dependent on the particle size distribution as well as external factors such as temperature and chemical environment. Small particles (<1 micron) tend to remain stably dispersed against gravitational settling due to the effects of Brownian motion. Larger particles (>>1 micron) will tend to settle out of an emulsion within the time frame of typically desirable shelf lives for emulsion based products (1 month to 1 year); this precipitate is sometimes redispersable but is always undesirable. Viscosity of the emulsion may play an important role in preventing or slowing the settling of larger particles. Consequently, factors such as percent solids of the emulsion and the presence of thickeners can also influence storage stability. The photoresist emulsions described herein are optimally stable if the D(v, 0.9) is less than about 1.4 microns, and preferably less than about 1.0 microns. By using the technique of partial neutralization of the acid functional resin and addition of non-ionic surfactant(s) containing poly(ethylene-oxide) segments such particle sizes are readily obtainable as is demonstrated in the examples discussed below.

The photoresist coating is thereafter dried to provide a contact imageable film layer on the metallic surface. Drying may be accomplished using conventional drying techniques. However, convection or IR heating or a combination thereof may be desirable to increase the drying speed. Drying temperatures higher than about 300° F. should be avoided as thermally-induced polymerization or volatilization of some components may occur. Drying temperatures less than about 250° F. are preferred. Generally a photoresist coating on metal of about 0.0001 to about 0.002 inch thickness is obtained following removal of water and drying.

Subsequently, the dry photoresist surface is exposed to actinic radiation in an image-wise fashion. Since negative-acting photoresists monomers are being used, the image-bearing transparency used is such that the coating on the metal areas to be protected from the etchant bath are exposed to the radiation.

Radiation used in the present invention preferably has a wavelength of 200–600 nm. Suitable sources of actinic radiation include carbon arcs, mercury vapor arcs, fluorescent lamps with phosphorus emitting ultraviolet light, argon and xenon glow lamps, tungsten lamps, and photographic flood lamps. of these, mercury vapor arcs, fluorescent sun lamps, and metal halide lamps are most suitable. The time required for the exposure will depend upon a variety of factors which include for example, the individual photoactive groups used in the emulsion, the proportion of these groups in the emulsion, the type of light source, and its distance from the composition. Suitable times may be readily determined by those familiar with photoimaging techniques.

The developer used in the present process is selected according to the nature of the resin, the photopolymer and photolysis products, and may be an aqueous or aqueous organic solution of a base. The use of a base to form a salt, and hence solubilize the fractions of photoactive photopolymer or resin remaining in the areas of coating which are to be removed after irradiation, is preferred. Such basic solutions are, typically, about 0.25% to about 3.0% by weight sodium or potassium hydroxide or carbonate. After development of the image formed by the radiation, the areas of coating unexposed to radiation are removed. Thus, the image resulting from development selectively coats the substrate and the imaged metal surface can be left "as is" or further processed.

In a preferred embodiment, the selectively coated surface is copper laminate and is further processed to prepare electrical traces for circuit boards. The copper surface layer can be laminated onto any suitable support substrate such as paper, epoxy glass reinforced epoxy, polyimides, polytetrafluorethylene and the like. As mentioned above, the processing step taken would be to process the copper surface in an etching solution. Etching solutions that may be used to remove the uncovered copper metal after development are known in the art and may be varied according to the nature of the metal surface. For example, with a copper surface, an acidic solution of ammonium persulfate, cupric chloride or ferric chloride is usually used. Another cupric chloride etching solution is basic aqueous ammonium hydroxide/cupric chloride.

After etching the resist coated surface is generally removed by a warm (57° F.) spray of about 3% to about 5% by weight aqueous base solution, e.g., aqueous sodium hydroxide.

In order to further illustrate the present invention and the advantages thereof, the following examples are provided. However, these examples are in no way meant to be limitative, but merely illustrative.

Examples 1 through 4 are illustrative of the direct emulsification technique and show the effect of neutralization levels on particle size.

A solution of a negative photoresist formulation was prepared with the following components:

780 g Scripset 550 (Monosanto) (Partially esterified styrene-maleic anhydride copolymer), 324 g Sartomer 454 (Sartomer) (ethoxylated trimethylolpropane triacrylate), 96 g Irgacure 651 (Ciba) (2,2-dimethoxy-2-phenyl acetophenone), 0.96 g Baso Blue 645 (BASF) (oil soluble dye), and 1800 g Ethyl Acetate.

EXAMPLE 1

(0% Neutralized)

2.49 g Tergitial NP-70 surfactant (nonylphenyl polyether alcohol containing 70 EO units from Union Carbide) were dissolved in 136.9 g deionized water. 148.0 g of the photoresist solution were added over 20 minutes with mechanical stirring. 10.0 g deionized water were added dropwise and the crude emulsion stirred for one hour prior to sonication for 3 minutes with a Sonics & Materials 500 W disrupter using a ¾" high gain Q horn at an estimated 180 W level. The emulsion was then concentrated to 48.0% solids on a rotary evaporator. The particle size distribution was measured on a Malvern Mastersizer; the $D(v,0.5)$ and $D(v,0.9)$ were 1.22 and 2.51 microns, respectively. The emulsion evidenced a large amount of settling after standing for only a couple of days.

EXAMPLE 2

(5% Neutralized Emulsion)

An emulsion was prepared as in Example 1 above, except that 0.252 g lithium hydroxide were used to partially neutralize the resin. The $D(v,0.5)$ and $D(v,0.9)$ were 0.70 and 1.39 microns, respectively. The emulsion evidenced no settling after standing for two weeks; a small amount of settling was observed after 3–4 weeks.

EXAMPLE 3

(10% Neutralized Emulsion)

An emulsion was prepared as in Example 1 above except that 0.503 g lithium hydroxide were used to partially neutralize the resin. The emulsion was concentrated to 40.0% solids. The $D(v,0.5)$ and $D(v,0.9)$ were 0.40 and 0.67 microns, respectively. The emulsion evidenced no settling after standing for one month.

EXAMPLE 4

(15% Neutralized Emulsion)

An emulsion was prepared as in Example 1 above except that 0.755 g lithium hydroxide were used to partially neutralize the resin. The emulsion was concentrated to 44.3% solids. The $D(v,0.5)$ and $D(v,0.9)$ were 0.29 and 0.45 microns, respectively. The emulsion evidenced no settling after standing for one month.

EXAMPLE 5

(10% Neutralized)

Example 5 was prepared by inverse emulsification. In this example, 2.49 g Tergitol NP-70 surfactant, dispersed in 136.9 g deionized water, was added slowly to 148 g of the photoresist solution from Example 1. 0.503 g LiOH.H$_2$O in 10 ml water was added to partially neutralize the resin, and the crude emulsion stirred for one hour prior to sonication for 3 minutes with a Sonics & Materials 500 W disrupter using, a ¾" high gain Q horn at an estimated 180 W level.

The emulsion was then concentrated to 40% solids on a rotary evaporator. The particle size distribution $D(v,0.5)$ and $D(v,0.9)$ were 0.44 and 1.0 microns, respectively, which is substantially larger than that obtained in Example 3 via a direct emulsification technique.

Examples 6 and 7 demonstrate the effectiveness of partial neutralization in providing stability towards addition of associative thickener. The emulsions were prepared by direct emulsification.

EXAMPLE 6

(5% Neutralized Emulsion)

An emulsion was prepared as in Example 2 above except that 1.81 g Stepan Polystep A16-22 (sodium alkylbenzene sulfonate) were codissolved with the Tergitol NP-70 prior to the addition of photoresist solution. The D(v,0.5) and D(v, 0.9) were 0.25 and 0.40 microns, respectively, after concentrating to 43.9% solids on a rotary evaporator.

To 13.67 g of this emulsion were added 4.33 g water and 0.3 g (1% solids/solids) Acrysol RM2020 (Rohm & Haas) non-ionic polyurethane associative thickener with stirring to provide a thickened emulsion with a pourable viscosity. Approximately 0.6 mil dried films, prepared by drawing down this emulsion on copper laminate, were observed to be substantially free of coagulum.

EXAMPLE 7

(0% Neutralized Emulsion)

An emulsion was prepared as in Example 6 above except that no lithium hydroxide was employed. The D(v,0.5) and D(v,0.9) were 0.75 and 1.60 microns, respectively, after concentrating to 47.6% solids on a rotary evaporator.

To 12.6 g of this emulsion were added 0.8 g water and 0.3 g (1% solids/solids) Acrysol RM2020 associative thickener (Rohm & Haas) with stirring to provide a thickened emulsion with a pourable viscosity. Approximately 0.6 mil dried films, prepared by drawing down this emulsion on copper laminate, were observed to be covered with numerous coagulum particles.

Examples 8 and 9 demonstrate the effectiveness of partial neutralization in providing stability towards addition of associative thickener. The emulsions were prepared via inverse emulsification.

EXAMPLE 8

(15% Neutralized Emulsion)

A solution of a negative photoresist formulation was prepared with the following components:

47.28 g Scripset 1710 (Monsanto), 23.64 g Carboset XL-27 (B. F. Goodrich), 23.64 g Carboset GA 1250 (B. F. Goodrich), 33.75 g Sartomer 454 (Sartomer), 6.75 g Irgacure 651 (Ciba), 0.3 g Victoria Pure Blue BO (BASF) (oil soluble dye), and 315.0 g Ethyl acetate.

To 130 g of this solution were added 0.4 g Triton X-100 surfactant (branched octylphenyl polyether alcohol containing 9–10 EO units from Union Carbide) followed by a solution of 0.216 g LiOH.H$_2$O in 67 g water, dropwise with mechanical stirring. A mixture of 1.2 g Polystep A16–22 surfactant and 0.303 g LiOH.H$_2$O in 93.8 g water was added dropwise. A mixture of 1.17 g Tergitol NP-70 surfactant in 1.17 g water was added. The crude emulsion was sonicated for 3 minutes with a Sonics & Materials 500 W disrupter using a ¾" high gain Q horn at an estimated 180 W intensity level. The emulsion was then concentrated to 48.7% solids on a rotary evaporator and filtered through a 44 micron sieve. To 15 g of the =emulsion were added 0.75 g RM 1020 associative thickener (Rohm & Haas) with magnetic stirring. No coagulum was evident after stirring 12 hours.

EXAMPLE 9

(0% Neutralized Emulsion)

To 130 g of the solution described in Example 8 above were added 0.4 g Triton X-100 surfactant followed by 67 g water, dropwise with mechanical stirring. A mixture of 1.2 g Stepan Polystep A16-22 surfactant in 93.8 g water was added dropwise. A mixture of 1.17 g Tergitol NP-70 surfactant in 1.17 g water was added. The crude emulsion was sonicated for 3 minutes with a Sonics & Materials 500 W disrupter using a ¾" high gain Q horn at an estimated 180 W intensity level. The emulsion was then concentrated to 50.3% solids on a rotary evaporator and filtered through a 44 micron sieve. To 15 g of the emulsion were added 0.75 g RM 1020 (Rohm & Haas) nonionic polyureathane associative thickener with magnetic stirring. Massive coagulation occurred almost immediately.

Examples 10 through 19 demonstrate relative efficiencies of various types of ethylene-oxide segment containing surfactants in stabilizing a 10% neutralized photoresist emulsion.

EXAMPLE 10

An emulsion was prepared as in Example 3 above except that 2.49 g of Triton X-705 surfactant (branched octylphenyl polyether alcohol containing 70 EO units, 70% solids from Union Carbide) were used instead of Tergitol NP-70. The D(v,0.5) and D(v,0.9) were 0.43 and 0.61 microns, respectively. No settling was observed for 3–4 weeks.

EXAMPLE 11

An emulsion was prepared as in Example 3 above except that 2.49 g of Triton X-405 surfactant (branched octylphenyl polyether alcohol containing 40 EO units, 70% solids from Union Carbide) were used instead of Tergitol NP-70. The D(v,0.5) and D(v,0.9) were 0.42 and 0.59 microns, respectively. No settling was observed for 3–4 weeks.

EXAMPLE 12

An emulsion was prepared as in Example 3 above except that 2.49 g of Triton X-305 surfactant (branched octylphenyl polyether alcohol containing 30 EO units, 70% solids from Union Carbide) were used instead of Tergitol NP-70. The D(v,0.5) and D(v,0.9) were 0.44 and 0.65 microns, respectively. No settling was observed for 3–4 weeks.

EXAMPLE 13

An emulsion was prepared as in Example 3 above except that 2.49 g of Triton X-165 surfactant (branched octylphenyl polyether alcohol containing 16 EO units, 70% solids from Union Carbide) were used instead of Tergitol NP-70. The D(v,0.5) and D(v,0.9) were 0.57 and 1.09 microns, respectively. No settling was observed for 3–4 weeks.

EXAMPLE 14

An emulsion was prepared as in Example 3 above except that 1.74 g of Triton X-100 surfactant (branched octylphenyl polyether alcohol containing 9–10 EO units from Union Carbide) were used instead of Tergitol NP-70. The D(v,0.5) and D(v,0.9) were 0.59 and 1.12 microns, respectively. No settling was observed for 3–4 weeks.

EXAMPLE 15

An emulsion was prepared as in Example 3 above except that 1.78 g of Witconol H31A surfactant (polyethylene glycol monooleate with 9 EO units from Witco) were used instead of Tergitol NP-70. The D(v,0.5) and D(v,0.9) were 0.60 and 1.12 microns, respectively. No settling was observed after 3 weeks.

EXAMPLE 16

An emulsion was prepared as in Example 3 above except that 1.78 g of Pluronic F127 surfactant (polyoxyethylene-polyoxypropylene block copolymer, HLB=18-23 from BASF) were used instead of Tergitol NP-70. The D(v,0.5) and D(v,0.9) were 0.46 and 0.89 microns, respectively. No settling was observed after one month.

EXAMPLE 17

An emulsion was prepared as in Example 3 above except that 1.78 g of Pluronic P-105 surfactant (ethylene oxide-propylene oxide-ethylene oxide block copolymer, HLB=12-18 from BASF were used instead of Tergitol NP-70. The D(v, 0.5) and D(v, 0.9) were 0.44 and 0.73 microns, respectively. No settling was observed after one month.

EXAMPLE 18

An emulsion was prepared as in Example 3 above except that 1.78 g of Tetronic 908 surfactant (ethylene oxide-propylene oxide tetra functional block copolymer derived from ethylenediamine from BASF were used instead of Tergitol NP-70. The D(v, 0.5) and D(v, 0.9) were 0.47 and 0.89 microns, respectively. No settling was observed after one month.

EXAMPLE 19

An emulsion was prepared as in Example 3 above except that 1.78 g of Pluronic L35 surfactant (ethylene oxide-propylene oxide-ethylene oxide) were used instead of Tergitol NP-70. The D(v, 0.5) and D(v, 0.9) were 0.60 and 1.25 microns, respectively. No settling was observed after one month.

Examples 20 through 22 demonstrate the instability of emulsions using non-EO containing surfactants.

EXAMPLE 20

An emulsion was prepared as in Example 3 above except that 1.81 g of Fluorad FC430 surfactant (a fluoroaliphatic polymeric ester, 98.5% solids from 3M) were used instead of Tergitol NP-70. The D(v,0.5) and D(v,0.9) were 0.71 and 1.47 microns, respectively. Some settling was observed after five days.

EXAMPLE 21

An emulsion was prepared as in Example 3 above except that 8.09 g of Polystep A16-22 surfactant (22% solids from Stepan) were used instead of Tergitol NP-70. The D(v,0.5) and D(v,0.9) were 0.96 and 1.73 microns, respectively. Settling was observed after 6 days.

EXAMPLE 22

An emulsion was prepared as in Example 3 above except that 4.45 g of Dowfax 8390 surfactant (disodium hexadecyl diphenyl oxide disulfonate/disodium dihexadecyl diphenyl oxide disulfonate, 40% solids from Dow Chemical Co.) were used instead of Tergitol NP-70. The D(v,0.5) and D(v,0.9) were 1.33 and 2.20 microns, respectively. Settling was observed after 3–4 days.

Examples 23 and 24 demonstrate the importance of order of addition during the direct emulsification process in achieving efficient particle size reduction:

A solution of a negative photoresist formulation was prepared with the following components:

52.92 g Scripset 1710 (Monsanto),
26.44 g Carboset GA 1250 (B. F. Goodrich),
26.44 g Carboset XL-27 (B. F. Goodrich),
42.80 g Sartomer 454 (Sartomer),
5.00 g Irgacure 907 (Ciba) (2-methyl-1-[4-(methythio) phenyl]-2-morpholinopropane-1),
4.08 g Irgacure 651 (Ciba),
0.84 g Speedcure ITX (Quantacure) (photosensitizer, isopropylthioxanthone),
0.16 g Benzotriazole (adhesion promoter),
0.82 g Leuco Crystal Violet (photosensitive dye, 4, 4', 4"-methylidynetris (N,N-dimethylaniline),
0.08 g Baso Blue 645 (BASF), and
375.0 g Ethyl Acetate.

EXAMPLE 23

(15% Neutralized Emulsion)

132.5 g of the above solution were added dropwise with stirring to a solution of 1.22 g Polystep A16-22 surfactant, 0.41 g Triton X-100 surfactant, and 2.34 g Tergitol NP-70 surfactant in 150.0 g water. To the crude emulsion was added a solution of 0.55 g LiOH in 12.94 g water dropwise. The emulsion was then sonicated for 3 minutes with a Sonics & Materials 500 W disrupter using a ¾" high gain Q horn at an estimated 180 W level. The emulsion was then concentrated to 42% solids on a rotary evaporator. The particle size distribution was measured on a Malvern Mastersizer; the D(v,0.5) and D(v,0.9) were 0.21 and 0.38 microns, respectively.

EXAMPLE 24

(15% Neutralized Emulsion)

An emulsion was prepared in a manner identical to that above except that the lithium hydroxide was dissolved in the surfactant solution prior to addition of the photoresist solution. After concentration to 45% solids the D(v,0.5) and D(v,0.9) were 0.38 and 0.67 microns, respectively.

Example 25 illustrates the technique of adding a solution of monomer(s) and initiator(s) to a partially (10%) neutralized resin emulsion.

EXAMPLE 25

The following components were combined and heated to 56° C. briefly with stirring to form a clear, viscous solution:

350.00 g Sartomer 9020 (Sartomer) (glycerol propoxy triacrylate),
59.81 g Irgacure 907 (Ciba), and
14.95 g Speedcure ITX (Quantacure).

To 601.9 g Acrysol I-2074 carboxylated acrylate copolymer (Rohm & Haas) were added 100.0 g deionized water with stirring. 4.97 g LiOH.H$_2$O were dissolved in 47.0 g deionized water and added dropwise to the stirred emulsion over 5 minutes. Next 25.4 g of a solution of Tergitol NP-70 surfactant (Union Carbide) in water (50% solids) was added and the emulsion stirred for 1 hour. 146.1 g of the monomer/photoinitiator solution described above was added over a period of 10 minutes and the emulsion stirred for an additional hour. The particle size at this point remained unchanged from the unmodified Acrysol I-2074 latex: D(v, 0.5)=0.15 microns and D(v,0.9)=0.25 microns. 3.08 g Neolan Blue 2G (Ciba) Water Soluble Dye were added and the emulsion stirred. for an additional 30 minutes. Finally, 21.4 g RM 2020 associative thickener were added with stirring to create a rheology appropriate for roll coating. The material demonstrated good shelf-life and shear stability.

Examples 26 through 28 illustrate the effect of base type on particle size and emulsion stability.

EXAMPLE 26

(10% Neutralized Emulsion—NaOH)

An emulsion was prepared as in example 3 above, except that 0.48 g sodium hydroxide were used to partially neutralize the resin. The emulsion had a particle size of D(v,0.5; v,0.9) of 0.49 and 0.94 microns, respectively. The emulsion evidenced no settling after standing for one month.

EXAMPLE 27

(10% Neutralized Emulsion—MDEA)

An emulsion was prepared as in example 3 above, except that 1.43 g of methyl diethanolamine were used to partially neutralize the resin. The emulsion had a particle size of D(v,0.5; v,0.9) of 0.52 and 1.02 microns respectively. The emulsion showed no signs of settling after two weeks.

EXAMPLE 28

(10% Neutralized Emulsion—Ammonia)

An emulsion was prepared as in Example 3 above, except that 0.683 g of ammonia were used to neutralize the resin. The emulsion had a particle size of D(v, 0.5; v,0.9) of 0.55 and 1.04 microns, respectively. The emulsion was stable for several days.

We claim:

1. An aqueous photoresist composition characterized by increased storage and shear stability said photoresist composition comprising an aqueous emulsion of:
   (a) carboxylic acid-containing resin;
   (b) photopolymerizable monomer;
   (c) photoinitiator;
   (d) a base that is selected from organic or inorganic bases, and mixtures thereof; and
   (e) non-ionic surfactant comprising poly(ethylene oxide) segments;
   wherein the particle size distribution of the emulsion having a D(v,0.9) is less than about 1.4 microns; wherein the base is present in an amount of no greater than 0.22 equivalents per acid equivalents on the resin, and wherein components (a)–(e) are present in the emulsion in an amount sufficient to provide a waterborne, stable, homogeneous photoresist coating material which is aqueous alkali developable to form an image on a metallic surface.

2. The photoresist composition of claim 1 wherein the amount of the base is present in the range of about 0.05 to about 0.2 equivalents per equivalents of acid on the resin.

3. The photoresist composition of claim 1 wherein the resin is selected form the group consisting of
   butadiene/acrylonitrile/methacrylic acid,
   styrene/acrylic acid,
   styrene/butadiene/acrylic acid,
   styrene/butadiene/methacrylic acid,
   styrene/butadiene/itaconic acid,
   styrene/butadiene/maleic acid,
   styrene/butadiene/butylacrylate/acrylic acid,
   styrene/butadiene/butylacrylate/methacrylic acid,
   styrene/butadiene/butylacrylate/itaconic acid,
   styrene/butadiene/butylacrylate/maleic acid,
   styrene/ethyl acrylate/methacrylic acid,
   styrene/maleic anhydride,
   styrene/methacrylic acid,
   vinylidene chloride/methacrylic acid, and
   any acrylic copolymer and mixtures of two or more of the foregoing.

4. The photoresist composition of claim 1 wherein the resin is a resin having a glass transition temperature of at least about 60° C.

5. The photoresist composition of claim 1 wherein the photopolymerizable monomer is an acrylate.

6. The photoresist composition of claim 5 wherein the acrylate is selected from the group consisting of
   ethylene glycol diacrylate,
   ethylene glycol dimethacrylate,
   propylene glycol diacrylate,
   propylene glycol dimethacrylate,
   trimethylolpropane triacrylate,
   trimethylolpropane ethoxylate triacrylate,
   trimethylolpropane propoxylate triacrylate,
   trimethylolpropane ethoxylate trimethacrylate,
   trimethylolpropane propoxylate trimethacrylate,
   bisphenol A diacrylate,
   phenoxyethyl methacrylate,
   hexanediol diacrylate,
   neopentyl glycol diacrylate,
   neopentyl propoxylate diacryalte,
   pentaerythritol tracrylate,
   dipentaerythritol hydroxypentaacrylate, and
   polyethylene glycol diacrylate and mixtures of two or more of the foregoing.

7. The photoresist composition of claim 1 wherein the photopolymerizable monomer is ethoxylated trimethylolpropane triacrylate and the resin is esterified styrene/maleic anhydride copolymer.

8. The photoresist composition of claim 1 wherein the photoinitiator is a member of the group consisting of benzoin ethers, benzil ketones, and phenones and mixtures of two or more of the foregoing.

9. The photoresist composition of claim 1 wherein the base is selected from the group consisting of an alkali metal salt, an amine and mixtures thereof.

10. The photoresist composition of claim 1 wherein the base is selected from the group consisting of lithium hydroxide, sodium hydroxide and potassium hydroxide and mixtures of two or more of the foregoing.

11. The photoresist composition of claim 1 wherein the solids content of the composition is in the range of about 20% to about 60% by weight of the composition.

12. The photoresist composition of claim 1 wherein the surfactant is about 0.1% to about 10% of the composition based on emulsion solids.

13. The photoresist composition of claim 12 wherein the surfactant is about 0.5% to about 5% of the composition based on emulsion solids.

14. The photoresist composition of claim 1 wherein the surfactant is an alkyl phenol ethoxylate, where the number of moles of ethylene oxide is greater than about 9.

15. The photoresist composition of claim 14 wherein the alkyl phenol ethoxylate surfactant is an ethoxylated octylphenol polyether alcohol.

16. The photoresist composition of claim 14 wherein the alkyl phenol ethoxylate surfactant is an ethoxylated nonyl phenol.

17. A circuit board comprising a metallic surface coated with a photoresist composition of claim 1.

18. A method of preparing a photoresist composition comprising the steps of:
   (a) preparing an emulsion by combining a non-ionic surfactant comprising poly (ethylene oxide) segments with water and an organic solution comprising:
      (i) carboxylic acid containing resin;
      (ii) photopolymerizable monomer; and
      (iii) photoinitiator;
   and completing the method with either of the following additional steps:
   I. (b) partially neutralizing the emulsion with a base selected from organic and inorganic bases and mixtures thereof; and
      (c) comminuting the neutralized emulsion until a particle size distribution having a D(v,0.9) no greater thin 1.4 microns is obtained;
   or
   II. (b) comminuting the emulsion until a particle size distribution having a D (v,0.9) no greater than 1.4 microns is obtained; and
      (c) partially neutralizing the emulsion with a base selected from organic and inorganic bases and mixtures thereof;
   or
   III.
      (b) comminuting the emulsion until a particle size distribution having a D(v,0.9) no greater than 1.4 microns is obtained;
      (c) evaporating the solvent and/or water from the emulsion until a total solids content no greater than about 60% by weight of the emulsion is achieved; and
      (d) partially neutralizing the emulsion with a base selected from organic and inorganic bases and mixtures thereof, wherein in each case the base is present in an amount of no greater than 0.22 equivalents per acid equivalent on the resin.

19. The method of claim 18 wherein the method of alternatives I and II further comprises the step of (d) evaporating the solvent and/or water from the emulsion until a total solids content no greater than about 60% by weight of the emulsion is achieved.

20. The method of claim 18 wherein the steps further comprise evaporating the solvent and/or water from the neutralized emulsion until the solid content of the emulsion is in the range of about 20% to about 60% by weight of the emulsion.

21. A method of preparing a photoresist composition comprising the steps of:
   (a) preparing an emulsion by combining a non-ionic surfactant comprising poly (ethylene-oxide) segments with water and an organic solution comprising:
      (i) carboxylic acid containing resin;
      (ii) photopolyrnerizable monomer; and
      (iii) photoinitiator and wherein a base selected from organic and inorganic bases and mixtures thereof is dissolved or dispersed in either the water or the organic solution thereby partially neutralizing the acid containing resin; and
   (b) comminuting the neutralized emulsion until a particle size distribution having a D (v,0.9) no greater than 1.4 microns is obtained;

wherein the base is preset in an amount of no greater than 0.22 equivalents per acid equivalent on the resin.

22. The method of claim 21 wherein the method further comprises the step of (c) evaporating the solvent and/or water from the emulsion until a total solids content no greater than about 60% by weight of the emulsion is achieved.

23. The method of claim 21 wherein the steps further comprise evaporating the water from the neutralized emulsion until the solid content of the emulsion is in the range of about 20% to about 60% by weight of the emulsion.

* * * * *